United States Patent
Hurwitt et al.

[11] Patent Number: 5,632,869
[45] Date of Patent: May 27, 1997

[54] METHOD OF PRETEXTURING A CATHODE SPUTTERING TARGET AND SPUTTER COATING AN ARTICLE THEREWITH

[75] Inventors: Steven D. Hurwitt, Park Ridge, N.J.; Charles Van Nutt, Monroe, N.Y.

[73] Assignees: Sony Corporation, Tokyo, Japan; Materials Research Corporation, Gilbert, Ariz.

[21] Appl. No.: 845,854

[22] Filed: Mar. 3, 1992

Related U.S. Application Data

[63] Continuation of Ser. No. 575,328, Aug. 30, 1990, abandoned.

[51] Int. Cl.$^6$ .................................... C23C 14/34
[52] U.S. Cl. ................ 204/192.12; 204/192.13; 204/298.08; 204/298.12
[58] Field of Search .............. 204/192.12, 192.13, 204/298.12, 298.13, 298.08

[56] References Cited

U.S. PATENT DOCUMENTS

| | | | |
|---|---|---|---|
| 4,431,499 | 2/1984 | Henager, Jr. | 204/192 E |
| 4,610,774 | 9/1986 | Sakata et al. | 204/298.12 |
| 4,724,060 | 2/1988 | Sakata et al. | 204/298.12 X |
| 4,834,860 | 5/1989 | Demaray et al. | 204/298 |

FOREIGN PATENT DOCUMENTS

| | | | |
|---|---|---|---|
| 2641558 | 3/1978 | Germany . | |
| 2651382 | 5/1978 | Germany | 204/298.12 |
| 2752848 | 5/1979 | Germany | 204/298.12 |
| 0238478 | 11/1985 | Japan | 204/298.12 |
| 2118068 | 5/1990 | Japan | 204/298.12 |

OTHER PUBLICATIONS

Semple, W.E., "Sputtering Cathodes Having Variable Roughness", *IBM Technical Disclosure Bulletin*, vol. 12, No. 10, Mar. 1970.

Arimoto et al., "Improvement . . . Resistance", Conference, 27th Electronic Comp. Conf., Arlington, VA USA May 1977 pp. 61–67.

*Primary Examiner*—Nam Nguyen
*Attorney, Agent, or Firm*—Wood, Herron & Evans, L.L.P.

[57] ABSTRACT

A sputtering target is pretextured, prior to being subjected to the initial sputter precleaning and use in a sputter processing apparatus, by artificially roughening the sputtering surface of the target to produce a texture which functions, when used in the sputter coating of substrates, in a manner equivalent to the surface of a target roughened by an hour or more of a sputter burn-in process. The surface is textured by the machining of grooves or other irregular microstructure therein, by chemical etching, by mechanical abrading, or by another means other than sputter processing. A 0.05 to 3.0 millimeter texture size such as achieved with annular V-grooves 0.025 inches deep and spaced at 0.0625 inches is preferred.

12 Claims, 2 Drawing Sheets

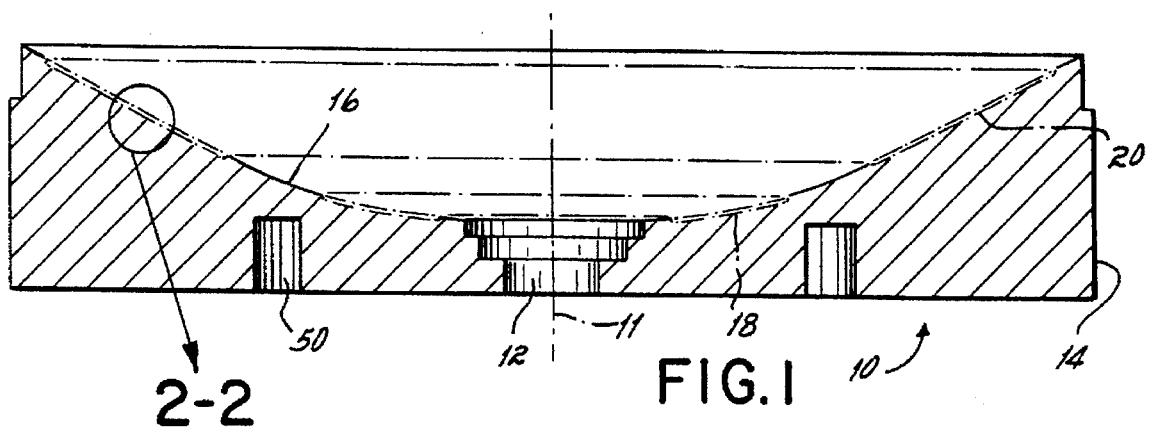
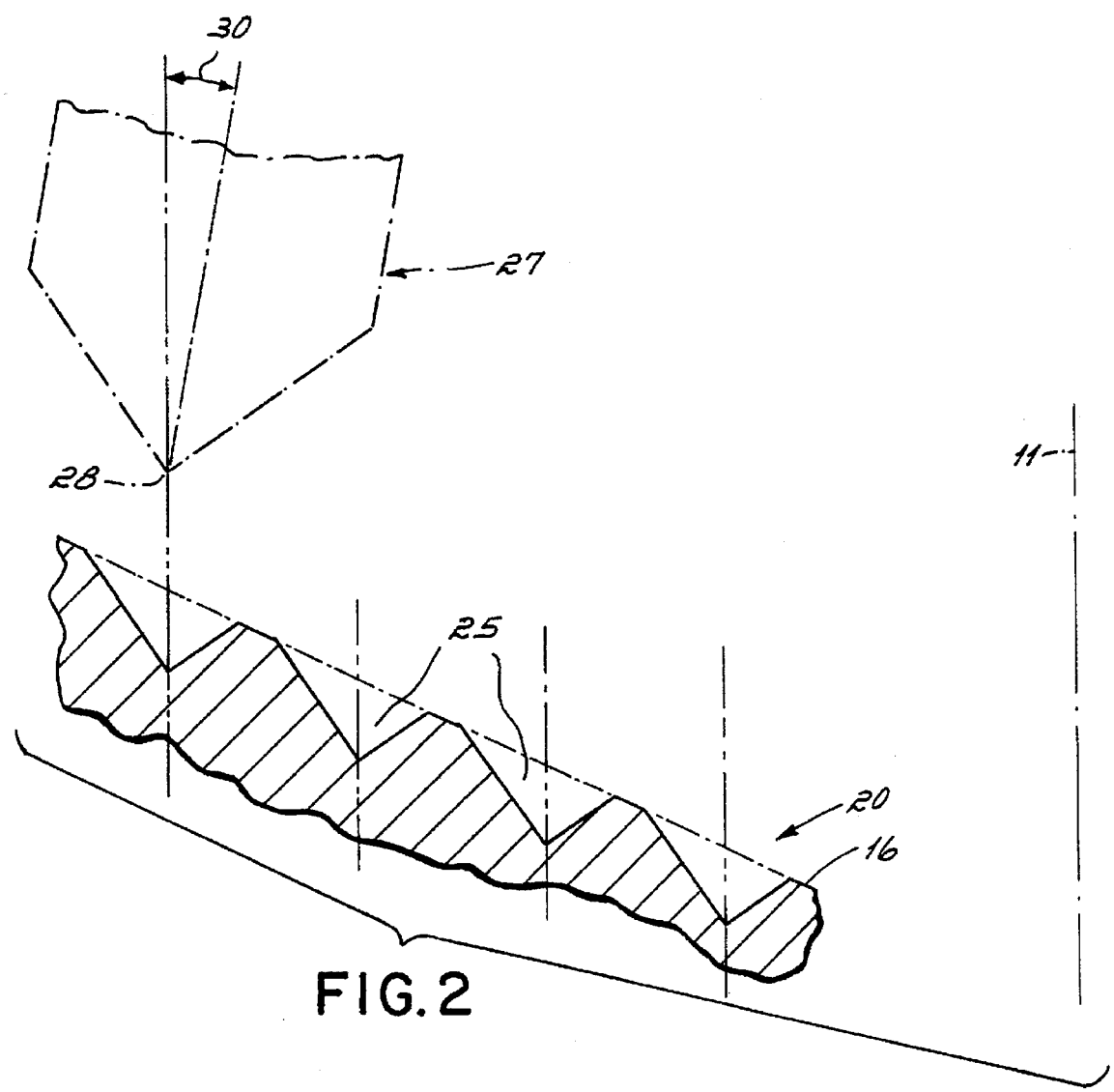

METHOD OF PRETEXTURING A CATHODE SPUTTERING TARGET AND SPUTTER COATING AN ARTICLE THEREWITH

This is a Request for filing a continuation application under 37 CFR 1.62 of prior application Ser. No. 07/575,328, filed on Aug. 30, 1990, abandoned, entitled PRETEXTURED CATHODE SPUTTERING TARGET AND METHOD OF PREPARATION THEREOF AND SPUTTERING TREREWITH.

The present invention relates to cathode sputtering and more particularly to cathode sputtering targets and methods of preparing the sputtering surfaces of cathode sputtering targets to provide a roughened texture which is normally achieved through target burn-in.

BACKGROUND OF THE INVENTION

Cathode sputtering processes are those in which a target, formed of a sputtering material which is to be deposited on the surface of a substrate, is supported in a vacuum chamber in a position facing the surface of the substrate to be sputter coated with the target material. A negative potential is then applied to the target to produce an electric field which will cause electrons to be emitted from the target surface toward a remote anode. In a magnetron sputtering apparatus, a magnetic field is imposed with magnetic lines of force which intersect the electric field, diverting the electrons along spiral paths whereby they become trapped over the target surface. The electrons ionize a sparse inert gas within the chamber causing positive gas ions to be formed, particularly where the electrons are densely trapped, forming a glow or plasma of high ion concentration. The ions are attracted to the negative target surface which they bombard, ejecting small particles of the sputtering target material. The particles of sputtering material emitted from the target surface strike and adhere to the surface of the substrate forming the sputtered coating.

Sputtering targets are formed of specialty materials which usually have stringent requirements for purity, crystal size, structure, etc. They are usually cast or otherwise molded and then machined to provide a sputtering surface of a specific macroscopic shape which will assume a particular geometric relationship with a substrate to be coated when mounted in a sputtering apparatus. Its surface is typically well polished. Invariably the sputtering surfaces of newly installed targets will contain oxides and other contaminants.

Before the sputter coating process can efficiently and effectively take place, however, the surface of a target, which has been newly installed in a sputtering apparatus, must be preconditioned. Preconditioning requires a cleaning of the target surface and a microscopic roughening of the target surface to produce a texture which will modify the electric field and draw the plasma close to the target surface. Typically, this preconditioning of the target surface, called "burn-in", is performed by sputtering in the sputtering chamber. During burn-in, the target surface is bombarded with ions which clean the surface, and then further bombarded until target material, which is usually more susceptible to removal by sputtering from crystal grain boundaries, is preferentially sputtered therefrom, forming a roughened texture or microstructure. This microstructure modifies the way the electric field lines form at the sputtering surface and tends to cause the plasma to draw closer to the surface, increasing the sputtering rate which a given electrical potential will produce.

A sputtering target, over its effective-coating lifetime, is usually operated either at constant power, or in a manner which maintains a constant deposition rate onto the surface of the substrate to be coated. The delivery of the desired sputtering power calls for operation of the power supply at some operating voltage, typically 500 to 600 volts, which will often decline over the useful sputtering life of the target. Such operation will require, however, an often undesirably high voltage to be applied to new target in order to condition its surface for sputtering onto substrates. Such a high voltage is required to develop the desired power level needed to effectively sputter clean a new, smooth, contaminated target. The initial and highest voltage to be applied to this target is a voltage which is required to efficiently remove surface oxides and other surface contaminants from the target surface during this initial preclean period. This voltage may be in the range of 900 volts where a typical operating voltage may be, for example, 600 volts.

Following the sputter precleaning process, additional sputtering of the target surface transforms the normally smoothly machined target surface to a roughened surface by the preferential removal of material from the grain boundary areas of the surface of the metallic target to expose the undisturbed crystal structure of the target. This is sometimes referred to as the target "burn-in." Until the surface of the target is so roughened, the plasma, or cloud of ions formed over the target surface, is insufficiently close to the target surface for electron and ion current to flow sufficiently. As a result, the "burn-in" voltage is also high, at least at the beginning of the burn-in process.

After a microtexture is developed by preconditioning the sputtering target surface, normal sputter coating of the target can take place in which the sputtering of material occurs at an effective rate and at a sufficiently safe voltage to deposit the coating onto the surface of the substrate. During the normal sputtering process, as material is sputtered from the target surface, an erosion groove will generally form in the surface of the target as target material is consumed and the target is ultimately expended.

During the various phases, which have heretofore been typically performed by sputtering in a sputter coating chamber, the voltage applied to the target begins at a high level and then gradually declines. This wide range of voltage variation over the life of the target is undesirable. A wide variation in the voltage produces more stringent demands upon the operation of the sputtering power supply, while a small variation allows the supply to operate over the life of the target closer to the design power limits of the power supply. Where the initial voltage must be considerably higher than the normal operating voltage needed for the sputtering process, design of the power supply to accommodate high initial voltages increases the cost of the power supply. Higher voltages also increase the risk of voltage breakdown which can damage sensitive devices on the substrate. Furthermore, the wide variation in voltage can result in inconsistencies in the deposition parameters throughout the coating processes, adversely affecting the film characteristics on the substrate over the target life.

Furthermore, the initial preparation of the target surface by sputtering, to texture the target through a target "burn-in" phase to develop surface irregularities having sufficient minute features the trap the plasma, typically takes several hours of operation. This several hour burn-in period preempts the use of the valuable sputtering apparatus for the productive coating of wafers, and in addition, involves several thousand dollars in operating costs.

Accordingly, there is a need to provide the surface of sputtering targets with the desired texture necessary for efficient sputter coating therefrom without subjecting the target to the high preconditioning voltage and long burn-in period heretofore required.

SUMMARY OF THE INVENTION

According to the principles of the present invention, a sputtering target is provided which has a surface artificially pretextured prior to any sputtering therefrom. The artificially pretextured surface simulates the texture of a conventional target achieved only after high voltage sputtering during an hour-long burn-in period. The pretexturing according to this invention is provided by a process other than that of subjecting the target to high voltage sputtering. The artificially produced texture of this invention provides, on the pretextured target surface, minute plasma trapping surface irregularities similar to those which would be produced on a target surface prepared through preferential sputtering of the grain boundaries and the exposure thereby of the crystal structure of the target during conventional high voltage burn-in of the target.

According to the preferred embodiment of the present invention, a target is pretextured by a machining process by which fine grooves are cut into the target surface. Alternatively, the target may be textured by other physical means such as abrasive grit blasting, or chemical etching or some other suitable roughening technique. The texture so produced by such a pretexturing method is small enough in feature size so as not to change the macroscopic shape of the target, and thereby not adversely affect the uniformity of the deposition which the target is designed to produce on the substrate. On the other hand, the texture is large enough to provide the necessary plasma trapping roughness, substantially larger than the sputtered particle size by several orders of magnitude. The texture dimensions are preferably between 0.05 and 3.0 millimeters, approximately, but somewhat smaller and larger dimensions are also effective.

When a target prepared according to the method of the present invention is initially installed in a sputtering apparatus, the plasma is immediately drawn close to the target surface. Thus, the target will energize at a voltage which will be, throughout the precleaning phase, substantially lower than the precleaning voltage during the equivalent phase with an otherwise untextured target such as those of the prior art. For example, the initial precleaning voltages with the pretextured target of this invention may be reduced from approximately 900 volts for a prior art untextured target, for example, to approximately 700 volts for the artificially pretextured target of this invention. Thereafter, following this initial precleaning phase, the target quickly reaches sputtering voltage and surface condition suitable for coating wafers, thus eliminating most or all of the burn-in period. Thus, the period when the target of the prior art is normally subjected to preferentially sputtering, typically of at least one or of several hours, to roughen its surface, the plasma will reside close to the surface of the pretextured target of this invention, permitting it to be used for productively coating wafers.

More particularly, a target, pretextured according to the present invention, will, during the time when a prior art untextured target is undergoing surface roughening, operate at a voltage which is substantially lower than that with an untextured target. The lower voltage will be, for example, reduced from about 750 volts to approximately 550 volts, a voltage at which sputtering at an effective rate can safely occur. Thus, with the target of the present invention, the normal texturing period found in prior art target preparation, constitutes part of the useful life of the target during which the sputtering may be employed to coat substrates. Also, during this period, the artificial texture of the pretextured target is eroded away such that it is eventually indistinguishable functionally, though distinguishable in microscopic appearance, from that of an initially untextured target after being subjected to the same amount of sputtering. Thus, during the remainder of its operational life, the performance and features of the pretextured target will match those of the targets which are prepared and textured by the normal sputtering process.

As a result of the features which the present invention provides, the target may be installed and operated from an initial voltage which is substantially lower than that experienced with an untextured target in the same apparatus. The artificially textured target of the present invention may be usefully used in sputter coating targets substantially sooner after sputtering is initiated, by substantially eliminating the burn-in process, significantly extending the useful and productive operating life of the target, and increasing the productivity of the sputtering target, the sputtering machinery and the sputtering coating process. The operating costs of the burn-in period required with prior art targets are thereby reduced, and the output of the equipment is increased.

These and other objectives and advantages of the present invention will be more readily apparent from the following detailed description of the drawings, in which:

FIG. 1 is a cross-sectional view of a sputtering target according to one preferred embodiment of the present invention.

FIG. 2 is an enlarged detail view of the encircled portion 2—2 of the surface of the target of FIG. 1.

Figure 3:
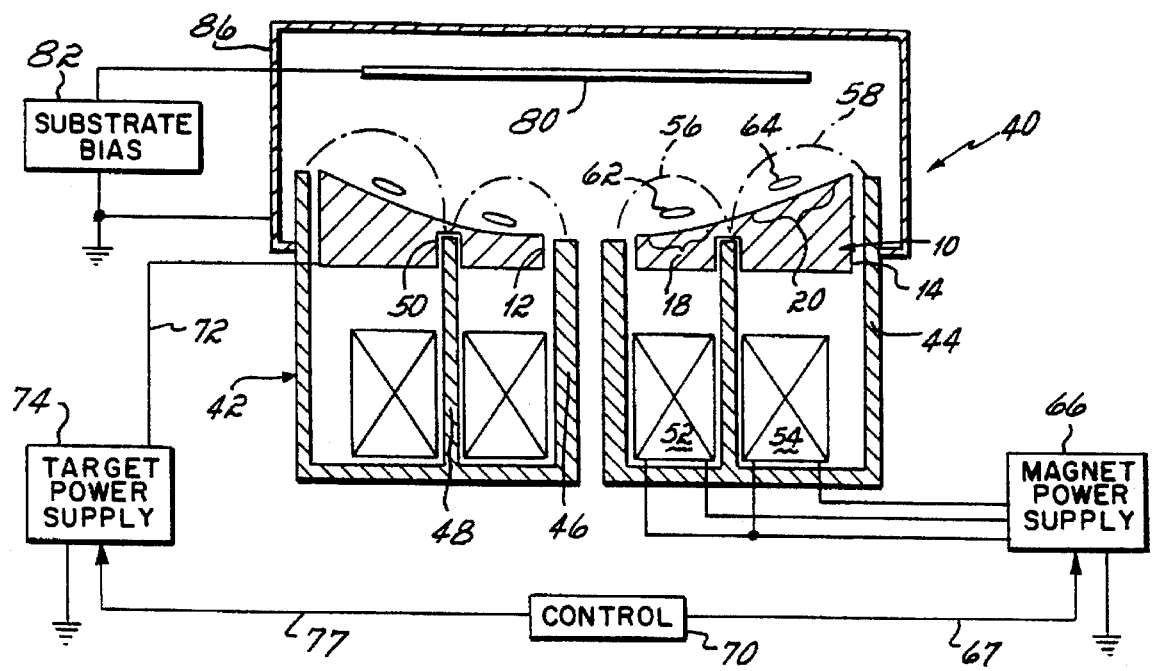
FIG. 3 is a diagram illustrating a sputtering apparatus employing the target of FIG. 1.

Referring to FIG. 1, a sputtering target 10 according to one embodiment of the present invention is illustrated. The target 10 is illustrative of only one of many target forms to which the present invention may be applied. The illustrated target 10 is annular in shape and formed of a single piece of sputtering material having a hole 12 at its center and a cylindrical outer edge 14. The target 10 has a smoothly contoured concave sputtering surface 16. The surface 16 has a macroscopic shape which is generally smooth and continuous, at least over the regions from which sputtering is to occur. These regions include an inner annular ring 18 and an outer annular ring 20.

According to principles of the present invention, surface 16 of the target 10 is imparted with a texture or microstructure illustrated in more detail in FIG. 2. In one preferred embodiment, the microstructure includes a plurality of annular V-shaped grooves 25 formed at least over the sputtering regions 18, 20 in the otherwise macroscopically smooth surface 16. In the preferred embodiment, the grooves are 0.025 inches deep and spaced at 0.0625 inches from center to center. These grooves 25 are individually cut on a lathe with a tool 27 having a 90° V-shaped tip 28 inclined at some angle 30 with respect to a line parallel the axis 11 of the target 10. The angle 30 is generally equal to the approximate average inclination of the target surface 16 with respect to the axis 11, or, for example, approximately 10°. The shape of the groove is preformed for manufacturing convenience, with many forms of groove or of other microtexture being functionally suitable. The grooves 25 are preferably provided over both regions 18, 20 from which sputtering is to occur, and the need be provided only over the sputtering regions. Texturing of only the sputtering regions is preferable when grooves are added by machining. When the microtexture is applied by chemical etching or certain abrasion methods, however, application to the entire surface may be more easily accomplished and thus preferable. In the specific embodiment illustrated, the grooves formed at the inner region are twenty-three in number and those formed at the outer region are thirty-four in number.

While it will be appreciated that the shape of the target 10, and the number of sputtering regions on the surface 16 of the target 10, may vary without departing from certain of the principles of the present invention, the invention is particularly useful with the target shown and described herein. The target herein described as a preferred and illustrated embodiment is a target described in, and preferred for use with the apparatus and methods set forth in, U.S. patent Ser. No. 07/339,308, filed Apr. 17, 1989 and entitled "Method and Apparatus for Sputter Coating Stepped Wafers." With such apparatus and methods, the sputtering takes place alternately from the two sputtering regions 18, 20 by alternate energization of magnetic fields over the respective regions 18, 20 to alternately trap plasmas thereover. Such apparatus is illustrated in the diagram of FIG. 3.

Referring to FIG. 3, the target 10 is shown supported in a target assembly 40 which includes a magnet core 42 having a cylindrical outer pole 44, a center post or pole piece 46 and a cylindrical intermediate pole piece 48. The outer pole piece 44 surrounds the outer edge 14 of the target 10 while the inner pole piece 46 projects through the central hole 12 of the target 10. The intermediate pole piece 48 extends into an annular groove 50 which is formed in the back surface of the target 10.

For purposes of the present invention, the magnets, of which the pole pieces 44, 46 and 48 of the magnet core 42 form a part, may be permanent magnets or electromagnets. In the preferred embodiment illustrated in FIG. 3, the magnets are electromagnets having inner and outer magnet windings 52, 54. When energized, the magnet windings 52 and 54 may be, for purposes of understanding the present invention, considered operating each with a constant magnet current. The magnets 52, 54 are alternately switched on and off so as to alternately maintain magnetic fields 56 and 58 at alternating times over the respective regions 18, 20 of the surface 16 of the target 10. The fields 56 and 58 are maintained alternately to alternately support respective plasmas 62 and 64 over the target regions 18, 20. The magnet currents are switching by a switching power supply 66, which switches in response to a control signal on a control line 67 from a programmable or settable control circuit 70. In synchronism with the switching of the magnet power supply 66 and the alternate switching of the plasmas 62 and 64, the power is applied to the target 10 through line 72 from the target power supply 74 and is switched between two power levels through a signal applied through line 77. The synchronism of the switching of the magnet power supply 66 with that of the target power supply 74 is maintained under the control of control 70. A substrate 80 to which the sputter coating is to be applied may, for some applications, also be subjected to a bias voltage through a substrate bias power supply represented generally by the box 82 in FIG. 3. The voltage of the substrate 80 may be alternatively maintained at the same voltage as a system anode 86 illustrated generally at ground potential in FIG. 3.

While illustrated in connection with a switched dual plasma apparatus using a one piece concave annular target, the features of the present invention are applicable to single plasma, planar and non-planar targets, and to systems which may be magnetron enhanced either with permanent or electromagnets. Furthermore, while a power supply 74 with a constant power output is described herein, this is done primarily for simplicity in the presentation of the description of the embodiments of the present invention. In that the early life of the target 10 is of interest in connection with such a description, considering the power supply to have a constant power output adequately illustrates the features of the invention. Over the life of the target, however, the total power output on line 72 of the target power supply 74 would more commonly be periodically adjusted or otherwise varied to maintain a constant deposition rate upon the wafer 80 at, for example, a rate of one micron for every 45 seconds of operation. This maintenance of constant deposition rate in the face of the phenomena known as rate roll-off, a phenomenon which occurs as the target is eroded over the course of its useful life, usually requires an increasing of the power output of the target power supply 74 over that life.

Figure 4:
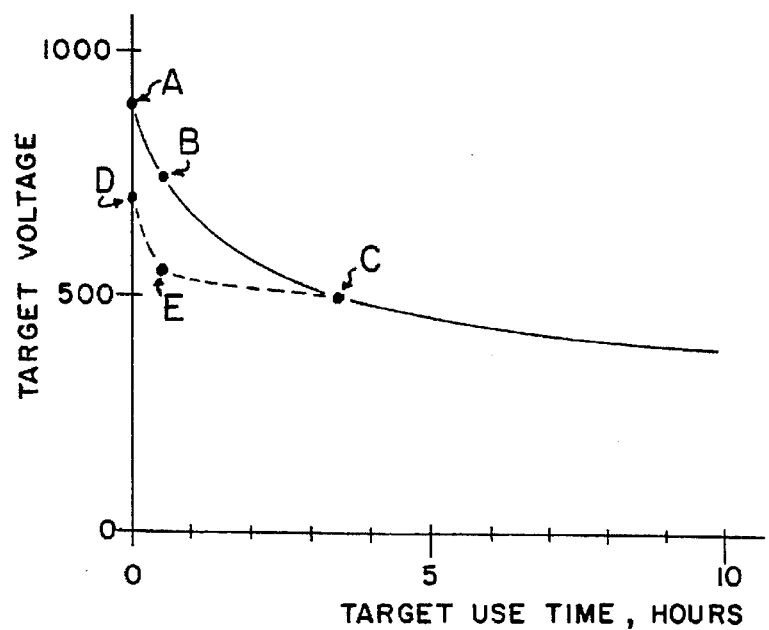
FIG. 4 is a graph comparing target voltage of an untextured target with that of a target according to the present invention operated at constant power and with either a permanent magnet or electromagnet with constant current in the apparatus of FIG. 1.

FIG. 4 shows the voltage on any given sputtering region of the target 10, over the early portion of the life of the target. Without the features of the present invention, a target, when operated at the target power levels which are constant, and with a magnet current which is constant, in the system of FIG. 3, will take the shape of the curve represented by the solid line of the graph of FIG. 4. This voltage will assume an initial value represented by point A in FIG. 4 which may be, for example, 900 volts. From point A, the target will normally be sputtered so as to clean the sputtering surface of the target to remove oxides and surface contaminants. This cleaning causes the power supply, set at a predetermined power level, to energize the target at this relatively high voltage. As cleaning progresses, the target voltage declines until the voltage reaches that of point B on the solid curve of FIG. 4, which may be, for example, 750 volts. This will occur after a fraction of an hour of operation, say, for example, ½ to ¾ of an hour. Following this initial period, the target will be operated for an additional 2 to 3 hours during which time the surface roughens as the sputtering tends to preferentially erode the grain boundaries of the target material of which the target 10 is made. This preferential sputtering exposes the crystal structure of the material which forms the target 10. As such, a degree of roughness is imparted to the target surface 16. As this roughness develops, the plasma in the region (outer region 20 in the example to which FIG. 4 corresponds) tends to be formed trapped close to the surface irregularities. This formation of the plasma is due, it is believed, to the electrostatic field effects caused by the microstructure of the exposed crystals. This change in the plasma as the surface roughens causes the sputtering rate to increase with an increase flow of current on the target surface, which in turn, causes the target voltage from the regulated power supply to decline toward that of point C on the graph of FIG. 4, which may be, for example, at a level of approximately 500 volts.

According to the illustrated embodiment of the present invention, the microstructure which would normally develop during the initial and roughen phases of the sputtering process as the voltage varies along the curve from point A to point B and then from point B to point C on the graph of FIG. 4, is artificially simulated by the formation of the microgrooves 25 or other artificial sputter texture so that the plasma trapping microstructure exists on the surface 16 of the target 10 prior to the first application of sputtering energy to the target. As with the power to the target regulated to produce a constant power output or constant deposition rate, the voltage which will develop on the target 10, will conform to that shown by the dotted line of FIG. 4 during the early life of the target. This voltage will, for example, start at a level shown by point D in FIG. 4 which may be, for example 700 volts, or approximately 200 volts less than the voltage shown as point A on the graph which would develop without the pre-existing artificially imposed microstructure on the surface 16 of the target 10. This voltage of the pretextured target will continue to decline to that shown at point E of FIG. 4, which is, for example, 550 volts. At this point, the initial cleaning of the target will have been completed and the target will have already arrived at a voltage and sputtering efficiency with which to begin its useful life of providing sputtered material for deposition onto substrates. In so performing, the target voltage will progress from that of point E to that of point C as the dotted line and the solid lines of FIG. 4 converge. During the portion of the curve from point E to point C, with the target pretextured according to the present invention, the artificial texture will cause plasma to be trapped near the microstructure near the target surface, allowing sputtering to proceed according to a normal operating voltage level approaching 500 volts. As such, the objects and advantages of the invention are realized.

The artificial creation of the microstructure prior to the initiation of the sputtering on the target surface may be imposed in a number of ways including but not limited to machining, mechanical abrasion, chemical etching, and other processes which will produce the microstructure or texture having a width and depth in the size range of from approximately 0.05 millimeters to approximately 3 millimeters. The effective range of size of such microstructures is not, however, critical but should be significantly large with respect to the sputtering particles being emitted, and sufficiently small so as to preserve the microscopic shape of the target surface 16.

Having described the invention, it should be apparent to those skilled in the art that its principles may be utilized by varying from the embodiments described above without departing from the principles of the present invention. Accordingly, the following is claimed:

1. A method of limiting the variation of the voltage of a sputtering target, and of limiting the sputter burn-in time of a sputtering target that is necessary before operating the target at an operating voltage and using the target in a sputter coating process in a vacuum processing chamber of a cathode sputtering apparatus for the productive deposition of a film onto semiconductor wafers, said method comprising the steps of:

fabricating a sputtering target while maintaining the target in an atmospheric pressure environment by:
forming the target from sputtering material to provide a sputtering surface thereon having a predetermined macroscopic shape, and
after forming the target and before exposing the target to a sputtering process, roughening the sputtering surface to create a microtexture thereon sufficiently smooth to avoid altering the macroscopic shape of the sputtering surface and having width and depth dimensions of at least approximately 0.05 millimeters;

after the fabricating of the target, maintaining the sputtering surface of the target in unsputtered condition, and, before sputtering therefrom, mounting and sealing the target in a sputter coating chamber of a sputter coating apparatus and maintaining a gas at a vacuum pressure level into the chamber;

energizing the unsputtered target so mounted and sealed in said chamber to a preconditioning voltage that is higher than the operating voltage but is not more than approximately 140% of the operating voltage during the first three hours of productive deposition of a film onto semiconductor wafers, and sputtering the target for not more than approximately one hour before introducing a wafer into the chamber and sputtering a commercially useful film onto a wafer from the target; then after not more than approximately one hour of sputtering at the preconditioning voltage, introducing a wafer into the chamber and energizing the target to the operating voltage, and sputtering a film onto the wafer from the sputtering target.

2. The method of claim 1 wherein:
the roughening step includes the step of machining at least a portion of the sputtering surface to a roughened texture.

3. The method of claim 2 wherein:
the roughening step includes the step of machining a plurality of grooves in the sputtering surface of the target.

4. The method of claim 1 wherein:
the roughening step includes the step of chemically etching the sputtering surface of the target to a roughened texture.

5. The method of claim 1 wherein:
the surface roughening step includes the step of physically abrading the sputtering surface of the target to a roughened texture.

6. The method of claim 1 further comprising the step of:
before completing the sputtering of commercially useful films therewith, sputtering the target surface at least until the microtexture created by the surface roughening step is removed.

7. A method of limiting the variation of the voltage of a sputtering target, and of limiting the sputter burn-in time of a sputtering target that is necessary before operating the target at an operating voltage and using the target in a sputter coating process in a vacuum processing chamber of a cathode sputtering apparatus for the productive deposition of a film onto semiconductor wafers, said method comprising the steps of:

fabricating a sputtering target while maintaining the target in an atmospheric pressure environment by:
forming the target from sputtering material to provide a sputtering surface thereon having a predetermined macroscopic shape, and
after forming the target and before exposing the target to a sputtering process, roughening the sputtering surface to create a microtexture thereon sufficiently smooth to avoid altering the macroscopic shape of the sputtering surface and having width and depth dimensions of at least approximately 0.05 millimeters;

after the fabricating of the target, maintaining the sputtering surface of the target in unsputtered condition, and, before sputtering therefrom, mounting and sealing the target in a sputter coating chamber of a sputter coating apparatus and maintaining a gas at a vacuum pressure level into the chamber;

energizing the unsputtered target so mounted and sealed in said chamber to a preconditioning voltage, before commercially useful films are sputtered onto a substantial number of wafers from the target, removing by sputtering the microtexture created by the surface roughening step; then sputtering a commercially useful film onto a substantial number of wafers in the vacuum chamber from the sputtering target.

8. The method of claim 7 wherein:

the step of energizing the target and sputtering therefrom before sputtering a commercially useful film therewith includes energizing the target at a preconditioning voltage that is higher than the operating voltage but is not more than approximately 140% of the operating voltage during the first three hours of productive deposition of a film onto semiconductor wafers, and sputtering the target for not more than approximately one hour; then after not more than approximately one hour of sputtering at the preconditioning voltage, energizing the target to the operating voltage, and sputtering a film onto the wafer from the sputtering target.

9. The method of claim 7 wherein:

the roughening step includes the step of machining at least a portion of the sputtering surface to a roughened texture.

10. The method of claim 9 wherein:

the roughening step includes the step of machining a plurality of grooves in the sputtering surface of the target.

11. The method of claim 7 wherein:

the roughening step includes the step of chemically etching the sputtering surface of the target to a roughened texture.

12. The method of claim 7 wherein:

the surface roughening step includes the step of physically abrading the sputtering surface of the target to a roughened texture.

* * * * *